US006703881B2

(12) United States Patent
Lu

(10) Patent No.: US 6,703,881 B2
(45) Date of Patent: Mar. 9, 2004

(54) FLIP-FLOP CIRCUIT

(75) Inventor: Shih-Lien L. Lu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 86 days.

(21) Appl. No.: 10/201,658

(22) Filed: Jul. 23, 2002

(65) Prior Publication Data
US 2002/0180503 A1 Dec. 5, 2002

Related U.S. Application Data

(62) Division of application No. 09/418,398, filed on Oct. 14, 1999.

(51) Int. Cl.[7] .......................... H03K 3/289; H03K 3/356
(52) U.S. Cl. ........................ 327/203; 327/208; 327/210; 327/218
(58) Field of Search ........................... 327/199–203, 327/208, 210–215, 218, 219

(56) References Cited

U.S. PATENT DOCUMENTS

| 3,993,916 A | | 11/1976 | Copeland, III et al. ........ 377/99 |
| 4,554,467 A | * | 11/1985 | Vaughn ........................ 327/211 |
| 4,691,122 A | | 9/1987 | Schnizlein et al. ............ 327/203 |
| 4,733,111 A | * | 3/1988 | Fassino et al. ................ 327/203 |
| 4,843,254 A | | 6/1989 | Motegi et al. ................. 327/203 |
| 5,264,738 A | | 11/1993 | Veendrick et al. ............. 327/203 |
| 5,491,444 A | | 2/1996 | McClure ........................ 327/525 |
| 5,619,157 A | | 4/1997 | Kumata et al. ................ 327/203 |
| 5,831,463 A | * | 11/1998 | Sachdev ........................ 327/202 |
| 5,854,565 A | | 12/1998 | Jha et al. ...................... 327/202 |
| 5,883,529 A | | 3/1999 | Kumata et al. ................ 326/93 |
| 6,188,260 B1 | | 2/2001 | Stotz et al. ................... 327/202 |

FOREIGN PATENT DOCUMENTS

JP          09-284101          10/1997

OTHER PUBLICATIONS

Ko, Uming.,et al. ,"High–Performance Energy–Efficient D–Flip–Flop Circuits", *IEEE Transactions on Very Large Scale Integration (VLSI) Systems, 8(1),* (2000),94–107.
Rabaey, Jan.M. ,"Digital Integrated Circuits—A Design Perspective", *Prentice Hall Electronics and VLSI Series,* (1996),Section 6.2.
Stojanovic, Vladimir.,et al. ,"Comparative Analysis of Master–Slave Latches and Flip–Flops for High–Performance and Low–Power Systems", *IEEE Journal of Solid–State Circuits, vol. 37,* (Apr. 1999),536–548.
Weste, Neil.H. ,et al. ,"Principles of CMOS VLSI Design: A Systems Perspective", 2nd Edition, Addison–Wesley Publishing Company, (1993),Section 5.5.
Yuan, Jiren.,et al. ,"New Single–Clock CMOS Latches and Flipflops with Improved Speed and Power Savings", *IEEE Journal of Solid–State Circuits, vol. 32,* (Jan. 1997),62–69.

* cited by examiner

Primary Examiner—Long Nguyen
(74) Attorney, Agent, or Firm—Schwegman, Lundberg, Woessner & Kluth, P.A.

(57) ABSTRACT

A low power, high performance flip-flop which does not require a full feedback path in the master stage includes a master stage driven by a data input, and an inverter. A slave stage includes a pass device for isolating the slave stage and the master stage, the slave stage having a feedback path for holding a data value passed to the slave stage.

21 Claims, 4 Drawing Sheets

FLIP-FLOP CIRCUIT

This application is a divisional of application U.S. Ser. No. 09/418,398 filed on Oct. 14, 1999.

FIELD

The present invention relates to flip-flops, and more specifically to master slave flip-flops.

BACKGROUND

Flip-flops have a wide variety of uses in today's computers and digital circuits. A flip-flop is used to generate a steady state output signal having either a high (logical one) or a low (logical zero) potential. As the uses for flip-flops increase, the desire to improve flip-flop performance and the desire to reduce power consumption has led to increased demand for high performance low power consumption flip-flops. Flip-flops are one of the most commonly used elements to implement sequential circuits, that is circuits in which the primary output relies not only on the current values of the input, but also the previous input values.

Master Slave D-flip flops (MS-DFF) are one of the most used types of flip-flops. They are used in building finite state machines, which the control logic of digital circuits are built upon. More advanced micro-architecture concepts, such as speculation, renaming, and out-of-order execution, are continuing to become more and more common. As such, the control logic portion of a microprocessor is becoming more and more important.

DFFs may also be used in holding a data value between pipeline stages in a data path. Therefore, high performance with reduced power consumption is desirable.

Conventional master slave D-flip flops triggered on the rising clock edge have two stages, a master stage 102 and a slave stage 104 as shown in FIG. 1. The stages are identical. When the clock signal is low, the first stage samples the data. At the same time, the second stage is isolated from the master stage by gate 106, and holds the previous data in latch 108. As the clock transitions to high, the master stage is isolated from the data input, and the slave stage is connected to the data input currently present in the master stage at the time the clock transitions to high. The previously sampled input data is transferred to the slave stage.

Each of the master and slave stages has a feedback loop in the form of a latch controlled by the clock signal CLK, its complement CLKiB as obtained by passing it through an inverter, and a delayed clock signal CLKi as obtained by passing it through yet another inverter. The feedback path holds the value in the slave stage when the clock is low and in the master stage when the clock is high. The FIG. 1 master slave flip-flop has a clock load of eight transistors.

For the reasons stated above, and for other reasons stated below which will become apparent to those skilled in the art upon reading and understanding the present specification, there is a need in the art for a flip-flop which has reduced power consumption and increased performance.

SUMMARY

In one embodiment, a flip flop includes a master stage having a pass gate and an inverter, the pass gate connected between an external data input and the inverter, the master stage driven directly by the data input, and a slave stage having a feedback path for maintaining a data input value, the slave stage isolated from the master stage when a clock signal is low, and connectable to the master stage inverter on a rising clock signal.

In another embodiment, a flip-flop includes a master stage having a first transistor, a first inverter with its input connected to the first transistor, and a first half weak feedback path, and a slave stage having a second transistor, a second inverter with its input connected to the second transistor, and a second half weak feedback path.

In yet another embodiment, a method includes supplying a data input to a first network having a pass device and an inverter, isolating the first network from a second network until a triggering event, connecting the first network to the second network to pass a new data value to the second network, and holding a passed data value in the second network using a feedback path.

Other embodiments are described and claimed.

DESCRIPTION OF EMBODIMENTS

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
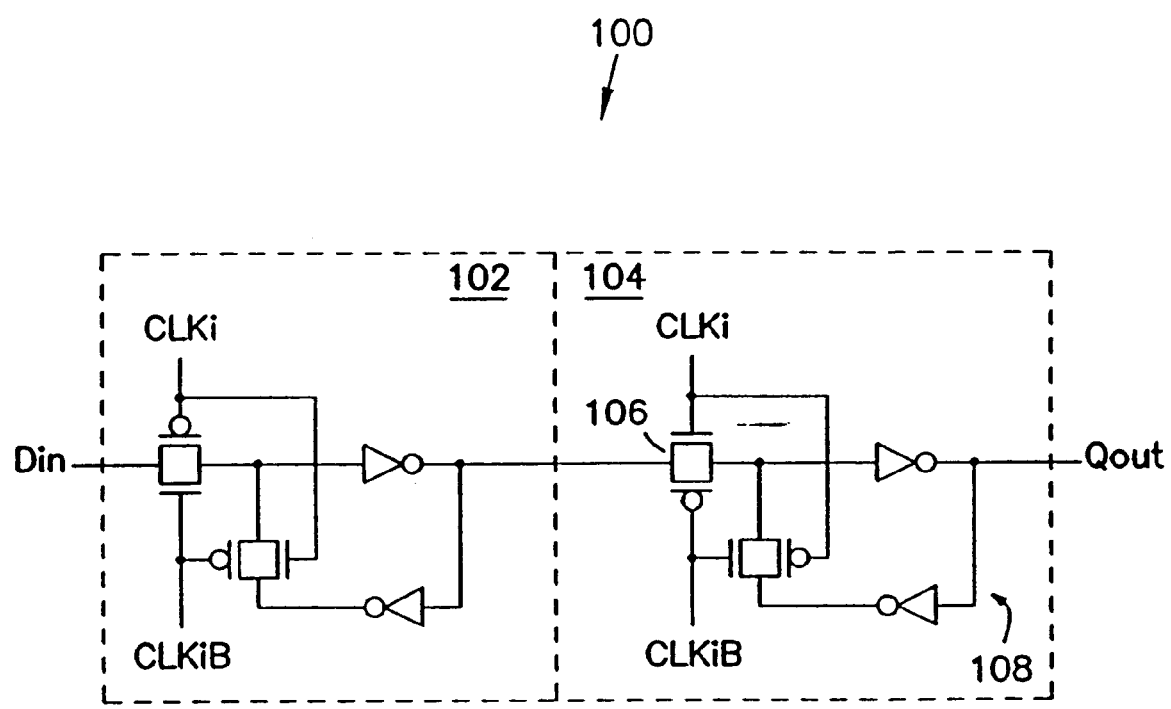
FIG. 1 is a circuit diagram of a prior art flip-flop.
Figure 2:
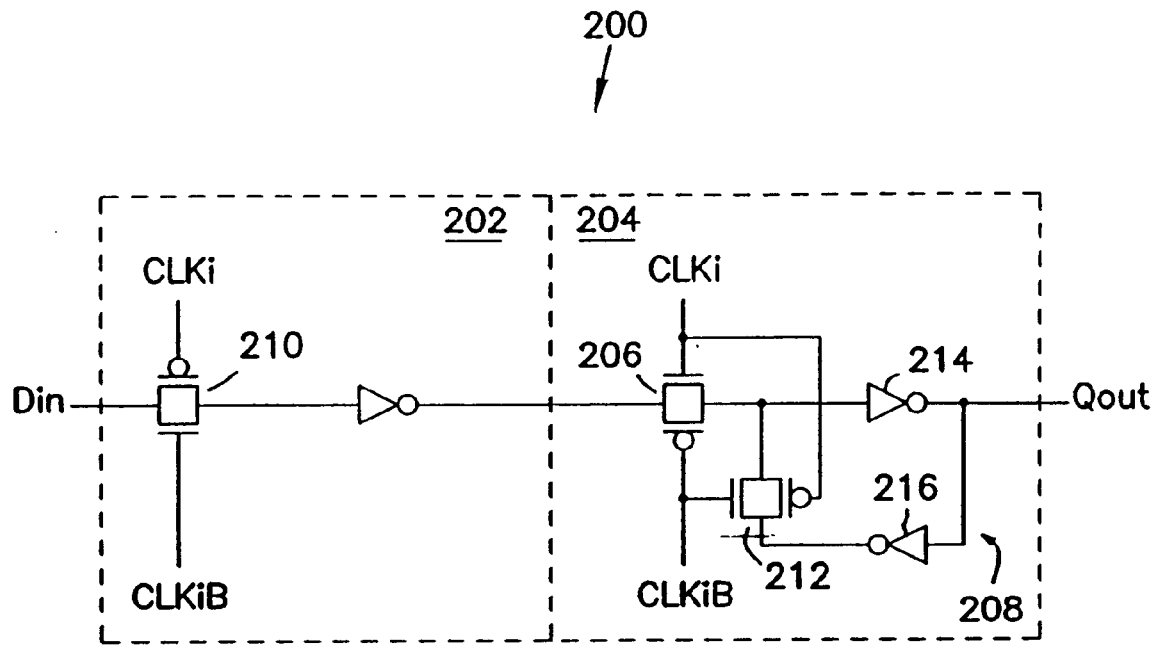
FIG. 2 is a circuit diagram of an embodiment of the invention.

Referring now to FIG. 2, an embodiment 200 of a flip-flop according to the present invention is shown. Flip-flop 200 is obtained by eliminating the feedback path from the master stage 202 of a master slave flip flop. While the slave stage 204 of flip-flop 200 is shown to be the same as the slave stage of the flip-flop 100, it should be understood that the slave stage of flip-flop 200 could be any slave stage to which a master stage passes a data input upon the transition of the clock signal from low to high. The feedback path present in the master stage of prior art flip-flops is not required by the present flip-flop 200 and others like it since its master stage 202 is driven by input data Din when the clock signal CLK is low. Therefore, there is no need to latch the data input signal since it is constantly supplied to the master stage 202.

When the clock signal is low, the slave stage 204 is isolated from the master stage 202 by the shut off of the pass device 206. In one embodiment, pass device 206 is a pass gate. Isolation of the slave stage 204 from the master stage 202 occurs when the transistors of gate 206 shut off due to the clock signal and its complement. The clock signals CLK, CLKiB, and CLKi have been discussed above. Because the slave stage is cut off or isolated from the master stage when the clock signal is low, feedback path 208 is still necessary in the flip-flop 200 to retain the slave stage data value.

In operation, the flip-flop 200 works as follows. When the clock signal CLK is low, CLKiB is high and CLKi is low. Gate 210 passes data input Din, and the master stage is driven by Din. Due to the clock signal and its complement, slave stage 204 is isolated from the master stage 202 when the clock signal is low. Slave stage 204 feedback path 208 holds the previous data value which was present at the slave stage when the slave stage was isolated from the master stage. Gate 212 allows the feedback path 208 to hold its previous value in a stable state. On the rising clock edge, the sampled data input Din from the master stage 202 is passed through to the slave stage 204 when the gate 206 transistors turn on. In this situation, the transistors of gate 212 turn off, and the data input signal Din is passed through to the slave stage 206 and to Qout. Gate 212 is on when gate 206 is off, and off when gate 206 is on. In one embodiment, feedback path 208 comprises inverters 214 and 216 connected in a loop with gate 212.

The clock loading of flip-flop 200 is only six transistors, less than the eight of the prior art flip-flop 100. Fewer transistors leads to lower power consumption. Overall performance of a flip-flop is determined by setup and hold time plus the CLK to Q (output) delay time. The CLK to Q time is determined by the slave stage of the flip-flop. The setup time is determined by the master stage. Power consumption of the flip-flop 200 is reduced by the lower load of transistors on the clock signal. The overall performance may be judged in some manner by the sum of the setup time and CLK to Q delay, both on the rising edge of the clock and the falling edge of the clock. The design of flip-flop 200 reduces power consumption due to the lower load of transistors on the clock. The design of flip-flop 200 improves performance by reducing the setup time and overall CLK to Q time.

Figure 2A:
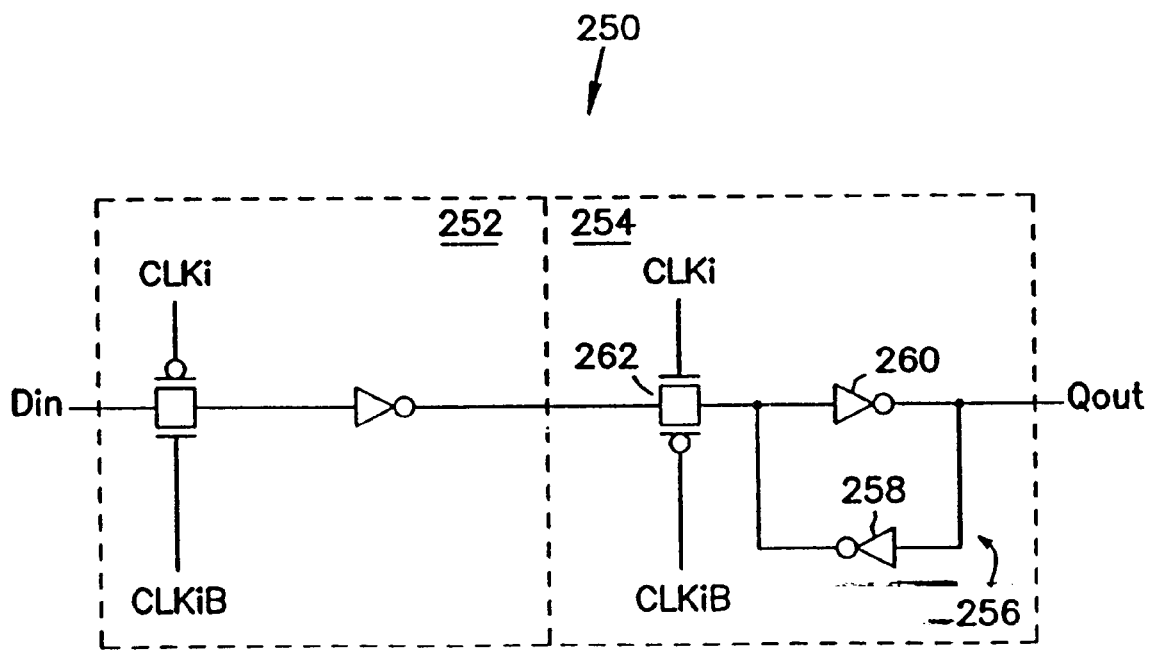
FIG. 2A is a circuit diagram of another embodiment of the invention.

Another embodiment 250 of a flip-flop according to the present invention is shown in FIG. 2A. The embodiment 250 reduces further the loading of transistors on the clock signal. As in embodiment 200, the feedback path in the master stage 252 is removed. The feedback path 256 in the slave stage 254 does not include a transmission gate such as gate 212 in FIG. 2. In one embodiment, two inverters 258 and 260 are connected back to back to form feedback path 256. In another embodiment, inverter 258 is a weaker inverter than inverter 260 in the forward path of the feedback path 256. In one embodiment, inverter 258 is approximately one-third the size of inverter 256. When inverter 258 is weak, a new data value can be forced into the inverter 258 for retaining the data value.

In operation, the flip-flop 250 works as follows. When the clock is low, master stage 252 is driven by data input Din, and no feedback path is required. Slave stage 254 is isolated from master stage 252 because transmission gate 262 is off. Slave stage 254 holds the previously passed data value in feedback path 256 as described above. On the rising clock edge, the pass or transmission gate 262 connects the slave stage 254 to the master stage 252. The data input Din is isolated from the master stage 252, and the sampled data input is passed to the slave stage 254. Data passed to the slave stage 254 is passed through to Qout. When the clock transitions to low, the transmission gate 262 once again isolates the slave stage from the master stage. The slave stage holds the data value passed to it from the master stage in the feedback path 256. Weak inverter 258 and stronger inverter 260 operate as described above to hold the data value.

The removal of a transmission gate from the feedback path 256 results in a lighter clock load. Accordingly, the embodiment 250 consumes less power than conventional master slave flip-flops such as flip-flop 100. Flip-flop 250 is a combined dynamic and static flip-flop with a weak feedback inverter.

Figure 3:
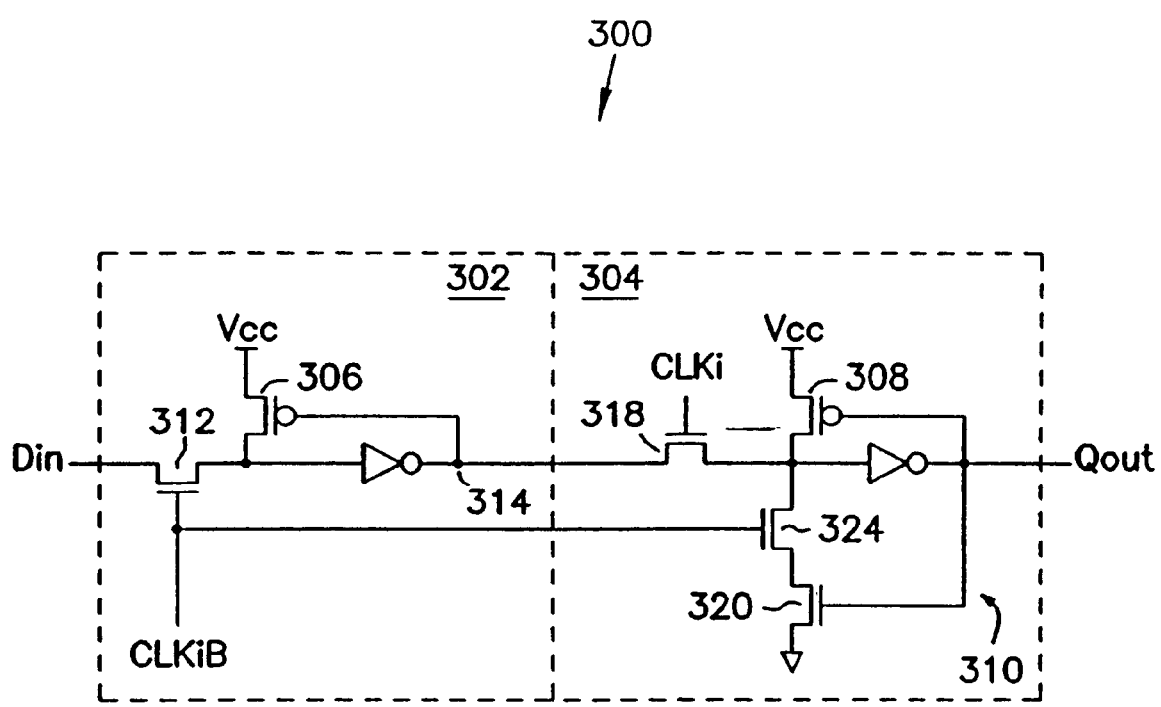
FIG. 3 is a circuit diagram of another embodiment of the invention.

Another embodiment 300 of a flip-flop according to the present invention is shown in FIG. 3. The embodiment 300 further reduces the loading of transistors on the clock signal. In transistors, N-type transistors have a better performance in switching, since the mobility of electrons is greater than that of holes. Because of this, the removal of P-type transistors in the gates of a flip-flop results in a lower clock load because fewer transistors are required for switching. However, due to threshold voltage of the N-type transistor, N-type transistors are not good pass transistors for logic one.

The complete removal of the feedback path from the master stage 302 of flip-flop 300 is therefore subject to failure due to the poor passing of logic one.

To remedy this, the flip-flop 300 has a half weak feedback path in each of the master stage 302 and slave stage 304 to assist in restoration of a full Vcc to logic one in the flip-flop 300. The flip-flop 300 operates substantially similarly to flip-flop 200, in that the full feedback path of a master slave flip-flop such as flip-flop 100 is not necessary. Instead, transistor 306 is used to pull the logic one signal of data in Din to a full Vcc when data in is at logic one. When CLK is low, CLKiB is high and CLKi is low as discussed above. When the clock is low, transistor 312 passes the data input Din to the master stage 302. Master stage 302 is driven by Din and therefore does not need a full feedback path.

However, due to the N-type pass transistor 312, if data input Din is logic one, the logic one may not be a strong logic one. Pull up transistor 306 is used when Din is logic one to bolster the value of the logic one to a full Vcc as follows. When Din is logic one, the signal at 314 is logic zero. This signal turns transistor 306 on, and a full Vcc is passed to node 316. When the clock signal CLK is low, slave stage 304 is isolated from master stage 302 because transistor 318 is off. Feedback path 310 is used to retain the data value last passed from master stage 302 to slave stage 304. Again, due to the weak passing of a logic one signal through pass transistor 318, transistor 308 is used as a pull up transistor to bolster a logic one signal to a full Vcc. Similarly, when the data input value passed to slave stage 304 is logic zero, the logic zero is fully restored by pull down transistor 320.

In operation, flip-flop 300 works as follows. When the clock signal CLK is low, slave stage 304 is isolated from the master stage 302 because transistor 318 is off. In this situation, slave stage 304 holds the last value passed to it by master stage 302 in feedback path 310. If data input Din was high when passed to slave stage 304, the signal at Qout is low. This low signal turns transistor 308 on, and pulls the value at node 322 to a full Vcc. Transistor 320 is off because of the low value at Qout. If the data input Din was low when last passed to slave stage 304, then with the clock low, slave stage will hold the value passed. In this situation, the value at Qout will be logic high. This in turn will turn off transistor 308 and turn on transistor 320. With the clock low, transistor 324 is on, and the low value at node 322 is fully restored to ground through transistors 320 and 324.

When the clock signal CLK transitions to high, master stage 302 is isolated from the data input Din, and slave stage 304 is connected to the master stage 302. Transistor 324 turns off, and the data input Din is passed from master stage 302 to slave stage 304 and through to Qout.

The clock loading of flip-flop 300 is only three transistors (transistors 312, 318, and 324), less than the eight of previous designs such as flip-flop 100 and less than the six of flip-flop 200. Flip-flop 300 has similar power savings and improved performance to flip-flop 200, except that power consumption is even lower due to the lower load of transistors on the clock signal CLK.

In another embodiment, the P-type half of a pass gate, or a P-type pass transistor, is used to pass data to the master stage and to the slave stage. In this configuration, due to the P-type pass transistors, if data input Din is logic zero, it may not be a strong logic zero. A pull down N-type transistor is used when Din is logic zero to restore the value of the logic zero.

Flip-flops 200 and 300 have fewer components than the prior art flip-flops such as flip-flop 100. Because the number of components has dropped, the size of flip-flops 200 and 300 is also smaller than that of flip-flop 100. With increasing density and the need to place as many devices onto a die as possible, a smaller flip-flop will lead to increased allowable density. Improved performance and reduced power consumption are also advantages of the flip-flop embodiments of the present invention.

In the flip-flop embodiments described above, the clock creating clock signals CLK, CLKiB, and CLKi may be turned off without the flip-flop losing the data value. When the clock is turned off to save power during sleep mode, the data value passed to the slave stage is maintained.

The flip-flop embodiments described above, while described in terms of rising edge flip-flops, are equally applicable to falling edge flip-flops without departing from the scope of the invention. It should be understood that while the discussions above describe generally rising edge flip-flops triggered by a triggering event of the clock signal rising, the triggering event may be another event, such as the falling clock edge, without departing from the scope of the invention.

Figure 4:
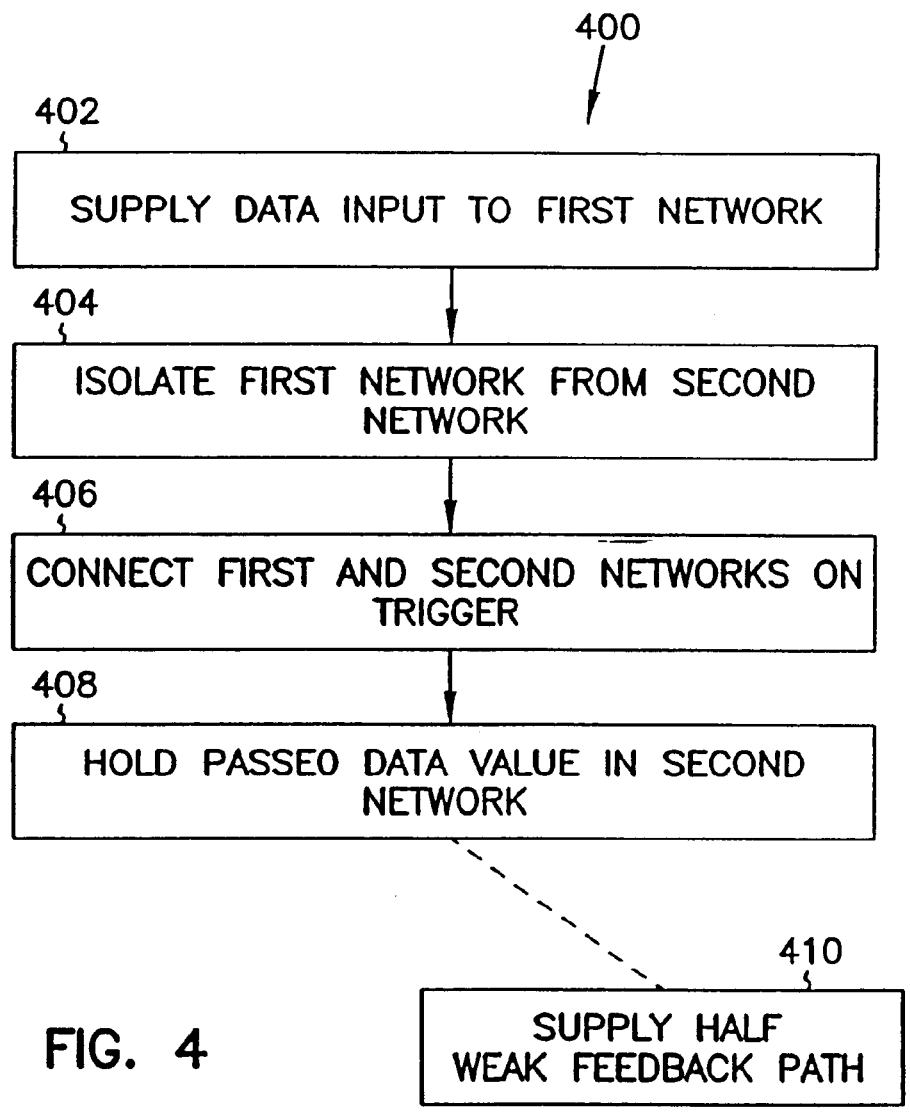
FIG. 4 is a flow chart diagram of yet another embodiment of the invention.

FIG. 4 illustrates a method of providing a stable output of a logic one or logic zero signal. Method 400 comprises supplying a data input to a first network having a pass device and an inverter in block 402, isolating the first network from a second network until a triggering event in block 404, connecting the first network to the second network to pass a new data value to the second network in block 406, and holding a passed data value in the second network using a feedback path in block 408. Holding the passed data value in block 408 comprises, in various embodiments, latching the data value, or latching the data value in a latch having a strong inverter and a weak inverter connected back to back. The method 400 may also comprise optionally supplying a half weak feedback path for restoring a passed logic one data value to a full logic one in block 410.

Figure 5:
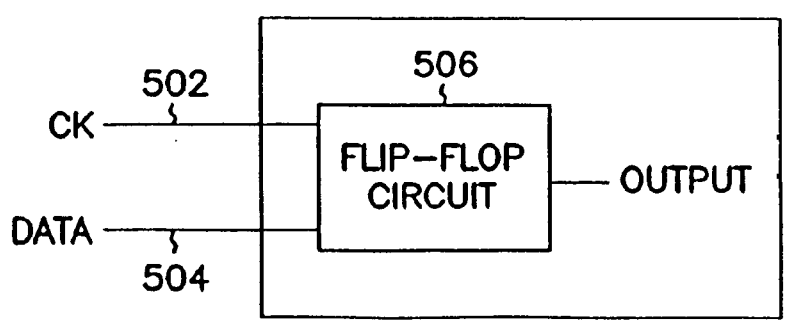
FIG. 5 is a block diagram of an integrated circuit embodiment according to one embodiment of the present invention.

FIG. 5 illustrates a block diagram of an integrated circuit 500 of the present invention. The integrated circuit 500 receives a clock signal 502, and at least one input data signal 504. The clock signal and the input data signal can be coupled to an internal flip-flop circuit 506. The flip-flop circuit 506 can be arranged as described above with respect to FIGS. 2, 2A, or 3. The integrated circuit may be any type of integrated circuit, including but not limited to a processor, memory, memory controller, or application-specific integrated circuit (ASIC).

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A flip-flop comprising:
    a master stage including a first transistor, a first inverter connected to the first transistor, and a first feedback path having only a transistor, the transistor being connected to the first inverter; and
    a slave stage including a second transistor connected to the first inverter, a second inverter connected to the second transistor, and a second feedback path connected to the second inverter, wherein the master stage includes fewer components than the slave stage, and wherein the second feedback path includes a third transistor connected between a positive potential and an input of the second inverter, the third transistor including a gate connected directly to an output of the second inverter.

2. The flip-flop of claim 1, wherein the transistor of the first feedback path includes:
    a first terminal connected to a positive potential, a second terminal connected to an input of first inverter, and a gate connected to an output of the first inverter.

3. A flip-flop comprising:
    a master stage including a first transistor, a first inverter connected to the first transistor, and a first feedback path having only a transistor, the transistor being connected to the first inverter; and
    a slave stage including a second transistor connected to the first inverter, a second inverter connected to the second transistor, and a second feedback path connected to the second inverter, wherein the master stage includes fewer components than the slave stage, the second feedback path including:
        a third transistor connected between a positive potential and an input of the second inverter, the third transistor including a gate connected to an output of the second inverter; and
        a fourth transistor and a fifth transistor connected in series between the input of the second inverter and ground, the fifth transistor including a gate connected to the output of the second inverter.

4. The flip-flop of claim 3, wherein the second feedback path includes only the third, fourth, and fifth transistors.

5. The flip-flop of claim 1, wherein the first feedback path includes fewer components than the second feedback path.

6. A flip-flop comprising:
    a master stage consisting only of a master transistor, a first inverter connected to the master transistor, and a first feedback path connected to the first inverter, the first feedback path including only one feedback transistor; an
    a slave stage including a second transistor connected to the first inverter, a second inverter connected to the second transistor, and a second feedback path connected to the second inverter, wherein the second feedback path includes only three feedback transistors, and the master stage and the slave stage includes unequal number of components.

7. The flip-flop of claim 6, wherein the feedback transistor of the first feedback path connects between a positive potential and an input of the first inverter, the feedback transistor of the first feedback path including a gate connected to an output of the first inverter.

8. The flip-flop of claim 7, wherein the second feedback path includes:
    a first feedback transistor connected between a positive potential and an input of the second inverter, the first feedback transistor including a gate connected to an output of the second inverter; and
    a second feedback transistor and a third feedback transistor connected in series between the input of the second inverter and ground, the second feedback transistor including a gate connected to a gate of the master transistor, the third feedback transistor including a gate connected to the output of the second inverter.

9. A method comprising:
    propagating an input signal to a master stage, the master stage consisting only of a master transistor, a first inverter connected to the master transistor, and a first feedback path having only a feedback transistor, the feedback transistor being connected to the first inverter; and
    feeding a slave stage with the input signal after the input signal propagates through the master transistor and the first inverter, the slave stage including a slave transistor connected to the first inverter, a second inverter connected to the slave transistor, and a second feedback path connected to the second inverter, wherein the master stage includes fewer components than the slave stage.

10. The method of claim 9 further comprising:
propagating the input signal from the slave stage to an output node.

11. A method comprising:
propagating an input signal to a master stage, the master stage including a first transistor, a first inverter connected to the first transistor, and a first feedback path having only a transistor, the transistor being connected to the first inverter; and
feeding a slave stage with the input signal after the input signal propagates through the first transistor and the first inverter, the slave stage including a second transistor connected to the first inverter, a second inverter connected to the second transistor, and a second feedback path connected to the second inverter, wherein the master stage includes fewer components than the slave stage, and wherein feeding the slave stage with the input signal includes propagating the input signal to second feedback path, the second feedback path including a third transistor connected between a positive potential and an input of the second inverter, the third transistor including a gate connected to an output of the second inverter, the second feedback path further including a fourth transistor and a fifth transistor connected in series between an input of the second inverter and ground, the fifth transistor including a gate connected to the output of the second inverter.

12. The method claim 9, wherein feeding the slave stage with the input signal includes propagating the input signal to the second feedback path, wherein the second feedback path includes only three transistors.

13. The method of claim 9, wherein propagating the input signal to the master stage includes propagating the input signal to the first feedback path, the first feedback path including fewer components than the second feedback path.

14. A method comprising:
propagating an input signal to a master stage of a flip-flop, the master stage consisting only of a first transistor, a first inverter connected to the first transistor, and a first feedback path connected to the first inverter, the feedback path including only a transistor; and
propagating the input signal from the master stage to a slave stage of the flip-flop, the slave stage including a second transistor connected to the first inverter, a second inverter connected to the second transistor, and a second feedback path connected to the second inverter, wherein the second feedback path includes only three transistors, and the master stage and the slave stage includes unequal number of components.

15. The method of claim 14 further comprising:
propagating the input signal from the slave stage to an output node.

16. The method of claim 14, wherein propagating the input signal to the master stage includes propagating the input signal to the first feedback path.

17. An integrated circuit comprising:
a first input node to receive a first input signal;
a second input node to receive a second input signal; and
a flip-flop connected to the first and second input nodes to receive the first and second input signals, the flip-flop including:
a master stage including a first transistor connected to the first and second input nodes, a first inverter connected to the first transistor, and a first feedback path having only a transistor, the transistor being connected to the first inverter; and
a slave stage including a second transistor connected to the first inverter, a second inverter connected to the second transistor, and a second feedback path connected to the second inverter, wherein the master stage includes fewer components than the slave stage, and the integrated circuit is a digital circuit, and wherein the second feedback path includes a third transistor connected between a logic one potential and an input of the second inverter, the third transistor including a gate connected directly to an output of the second inverter.

18. The integrated circuit of claim 17, wherein the transistor of the first feedback path includes:
a first terminal connected to a logic one potential, a second terminal connected to an input of first inverter, and a gate connected to an output of the first inverter.

19. An integrated circuit comprising:
a first input node to receive a first input signal;
a second input node to receive a second input signal; and
a flip-flop connected to the first and second input nodes to receive the first and second input signals, the flip-flop including:
a master stage including a first transistor connected to the first and second input nodes, a first inverter connected to the first transistor, and a first feedback path having only a transistor, the transistor being connected to the first inverter; and
a slave stage including a second transistor connected to the first inverter, a second inverter connected to the second transistor, and a second feedback path connected to the second inverter, wherein the master stage includes fewer components than the slave stage, and the integrated circuit is a digital circuit, and wherein the second feedback path includes:
a third transistor connected between a logic one potential and an input of the second inverter, the fourth transistor including a gate connected to an output of the second inverter, and
a fourth transistor and a fifth transistor connected in series between the input of the second inverter and logic zero, the fifth transistor including a gate connected to the output of the second inverter.

20. The integrated circuit of claim 19, wherein the second feedback path includes only the third, fourth, and fifth transistors.

21. The integrated circuit of claim 17, wherein the first feedback path includes fewer components than the second feedback path.

* * * * *